DEVICES FOR PRODUCING VOLTAGE PULSES

Filed June 23, 1960

INVENTOR.
ROBERT B. SEEDS
BY
Buckhorn, Cheatham & Blore
ATTORNEYS

United States Patent Office 3,173,020

Patented Mar. 9, 1965

3,173,020

DEVICES FOR PRODUCING VOLTAGE PULSES

Robert B. Seeds, 4194 Willmar Drive, Palo Alto, Calif.

Filed June 23, 1960, Ser. No. 38,371

9 Claims. (Cl. 307—88.5)

This invention relates to devices for producing voltage pulses having a short rise time and more particularly to pulse forming circuits utilizing avalanche transistors and preferably punched through avalanche transistors to produce very narrow voltage pulses having extremely short rise time.

The circuits of the present invention have utility in the production of sampling pulses in sampling oscilloscopes in which voltage pulses which are narrow relative to the width of the waveform of a signal to be sampled are employed to derive samples from such signal. The narrower the sampling pulses, the shorter the rise time of such pulses and the greater the amplitude stability and pulse time stability after a triggering pulse, the more accurate the sample produced.

As indicated above, punched through avalanche transistors can be employed in the circuits of the present invention. In such punched through avalanche transistors, a space charge region extends between the collector and emitter when the "punch-through" voltage is exceeded but before effective avalanche operation begins, such that the emitter terminal voltage tends to follow the collector terminal voltage at a potential between the base and collector terminal voltage. If the emitter terminal is connected to the base through a high impedance circuit, it acts as if such emitter terminal were clamped to the collector terminal after the collector to base bias reaches punch-through voltage and the collector space charge region has reached the emitter space charge region. Thus, the term "punched-through avalanche transistor" refers to a transistor whose punch-through voltage is lower than its avalanche breakdown voltage or its zener breakdown voltage. Transistors which are capable of avalanche operation without punching through are more difficult to make than those which punch through, but such punched through avalanche transistors have heretofore not been used in triggered circuits. In accordance with the present invention, such punched through avalanche transistors can be employed as effectively as normal avalanche transistors in triggered circuits and also advantage is taken of the fact that the punched through transistors exhibit substantial internal resistance to flow of base current so that they have effective built in resistance in the base circuit.

The circuits of the present invention are regenerative circuits in which an avalanche transistor or a punched through avalanche transistor is employed to produce narrow output pulses having short rise times in response to input triggering pulses. Such circuits also have low trigger delay characteristics in that the output pulse is produced in an extremely short time after the triggering pulse has reached the triggering potential. Such circuits also have high stability under changing temperature conditions in that they have very little temperature drift. Furthermore, the circuits of the present invention have low time jitter and negligible amplitude jitter, i.e., have high amplitude stability and pulse time stability. Thus the output pulse rise occurs at substantially a constant time after the trigger pulse reaches a given amplitude and the amplitudes of the output pulses are substantially independent of the amplitude or shape of the triggering pulses. The circuits of the present invention are also of extreme simplicity including their input and output connections and biasing connections.

While the circuits of the present invention are particularly adaptable to sampling oscilloscope operation, they are of general application wherever stable circuits for producing narrow pulses with short rise times are desired. For example, certain of such circuits have direct application in delay comparator circuits as the delay in pulse rise can be made a linear function of the potential on a control electrode in the circuit.

It is therefore an object of the invention to provide an improved device for producing narrow voltage pulses having extremely short rise times.

Another object of the invention is to provide an improved circuit employing an avalanche transistor or punched through avalanche transistor to produce narrow voltage pulses having short rise times in response to input triggering pulses of any desired form.

Another object of the invention is to provide a simple circuit for producing very narrow voltage pulses having extremely short rise times, which circuit has high stability against temperature drift and has low time jitter and negligible amplitude jitter.

A further object of the invention is to provide a circuit for producing pulses which are particularly adapted for sampling pulses in a sampling oscilloscope.

A still further object of the invention is to provide circuits employing punched through avalanche transistors to produce narrow voltage pulses having short rise times.

Other objects and advantages of the invention will appear in the following description of the various embodiments of the invention shown in the attached drawing of which:

Figure 1:
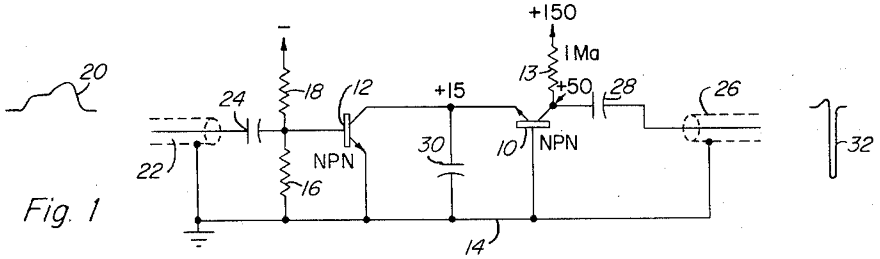
FIG. 1 is a schematic diagram showing a circuit utilizing a punched through avalanche transistor.

Referring more particularly to the drawing, the circuit of FIG. 1 includes a pulse producing transistor 10 of the NPN type operated as a punched through avalanche transistor and a triggering transistor 12 also of the NPN type. The collector of the transistor 10 is connected through a current limiting resistor 13 to a source of positive potential and the base of such transistor is connected to a common conductor 14 which in turn may be connected to ground.

The triggering transistor 12 has its emitter connected to the common conductor 14 and its collector connected to the emitter of the transistor 10. The base of the transistor 12 is connected to a biasing circuit including a resistor 16 connected between such base and the common conductor 14, and a resistor 18 connected between such base and a source of negative potential so as to provide the transistor with a small reverse bias between its emitter and its base. Under these conditions the transistor 12 has high impedance to current flow from its collector to its other electrodes so that the emitter of the transistor 10 is effectively a free or floating emitter.

With the resistor 13 connected to a positive potential of 150 volts D.C., the potential on the collector of the transistor 10, may, for example, be approximately 50 volts D.C. This assumes a flow of approximately one milliampere through the collector-base junction. Under these conditions the collector-base junction is reversed biased above the punch through voltage but below the avalanche breakdown voltage of transistor 10, and the emitter of the transistor 10 may, for example, assume a potential of approximately +15 volts D.C., i.e., a voltage between that of the collector and that of the base, such emitter voltage being effectively clamped at a constant voltage difference from that of the collector as is characteristic of punched through avalanche transistors.

An input triggering pulse indicated at 20 and of substantially any form may be applied between the common conductor 14 and the base of the transistor 12 through a coaxial line 22 having its central conductor connected to such base through a blocking capacitor 24. It will be apparent that the blocking capacitor and resistors 16 and 18 may be omitted if the steady state potential of the central conductor of such line is maintained at the correct bias potential for the base of the transistor 12. The outer conductor of the line 22 is shown as being connected to the common conductor.

An output line 26 has its central conductor connected to the collector of the transistor 10 through a differentiating and blocking capacitor 28 and its outer conductor connected to the common conductor 14. Also the emitter of the transistor 10 is connected to the common conductor 14 through a capacitor 30 which with capacitor 28 and coaxial line 26 completes a current feedback loop from the collector to the emitter through the internal impedance of such transistor.

When a positive going trigger pulse 20 is applied to the base of the transistor 12 from the line 22, a resulting negative going pulse appears at the emitter of the transistor 10 to trigger its operation to cause it to produce a narrow negative going pulse across the output line 26, the general form of such pulse being indicated at 32. The operation of the pulse producing circuits of the various figures will be discussed in more detail after the specific circuits of FIGS. 2 and 4 have been described.

Figure 2:
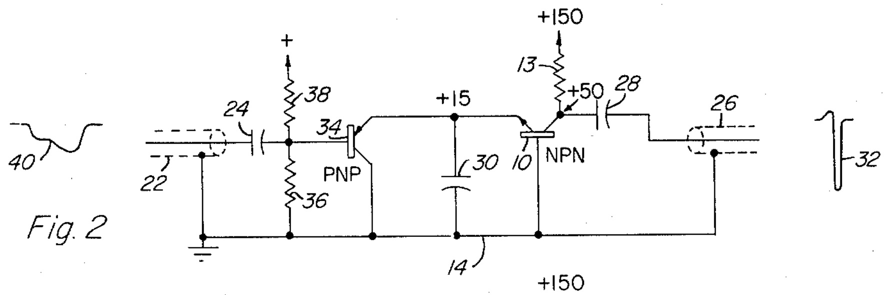
FIG. 2 is a diagram similar to FIG. 1, showing a circuit with a modified triggering arrangement.

The circuit of FIG. 2 differs from that of FIG. 1 only in that a PNP triggering transistor 34 with an appropriate biasing circuit including resistors 36 and 38 for producing a small positive bias on the base of the transistor 34 relative to its emitter has been substituted for the NPN triggering transistor 12 and its bias circuit of FIG. 1. With such positive or reverse bias on its base, the transistor 34 has high impedance to current flow from its emitter to its other electrodes. The other elements of the circuit of FIG. 2 are the same as those of FIG. 1 and the same reference numerals have been applied thereto. A negative going pulse indicated at 40 of any form applied to the base of the transistor 34 will cause a negative pulse to be applied to the emitter of the transistor 10 to produce an output pulse 32 across the output line 26.

Figure 3:
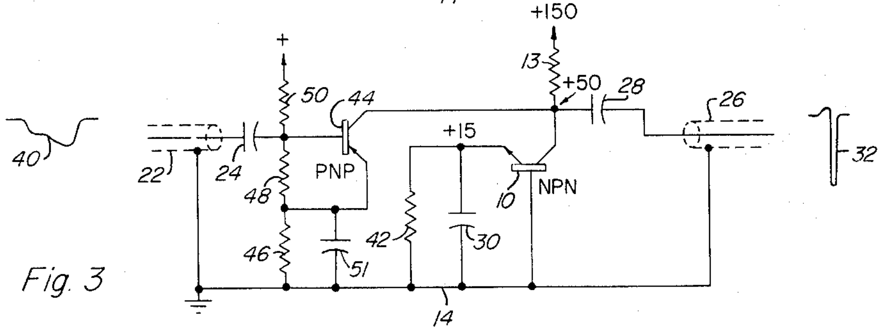
FIG. 3 is a diagram similar to FIG. 1, showing a circuit with another modified triggering arrangement.

The circuit of FIG. 3 illustrates another manner of triggering the pulse forming circuit including the transistor 10. In the circuit of such figure a positive going pulse is applied to the collector of the transistor 10 instead of a negative going pulse to the emitter of such transistor. This increases the current flow in the collector-base circuit of such transistor and as discussed below, this triggers the circuit to cause the transistor 10 to produce the negative going narrow pulse 32 in the output circuit.

In FIG. 3, the transistor 10 has its emitter connected to the common conductor through a resistor 42 of sufficiently high resistance that such emitter is effectively floating instead of such emitter being connected to a triggering transistor as in FIGS. 1 and 2. The collector of the transistor 10 is connected to the collector of a PNP transistor 44 having its emitter connected to a point in a voltage divider circuit including resistors 46, 48 and 50 connected in series between a source of positive potential and the common conductor 14, the emitter being by-passed to the common conductor 14 by a capacitor 51. The base of the transistor 44 is connected to such voltage divider circuit at a point having a somewhat greater positive potential than that of the emitter and greater than the potential of the collector of such transistor so that there is high resistance to current flow between the collector of such transistor and its other electrodes. A negative going pulse 40 applied to the base of the transistor 44 from the input line 22 will cause a positive going pulse to be applied to the collector of the transistor 10 to trigger its pulse forming operation. It will be apparent that other circuits for applying such a positive pulse to the collector of the transistor 10 can be employed.

Figure 4:
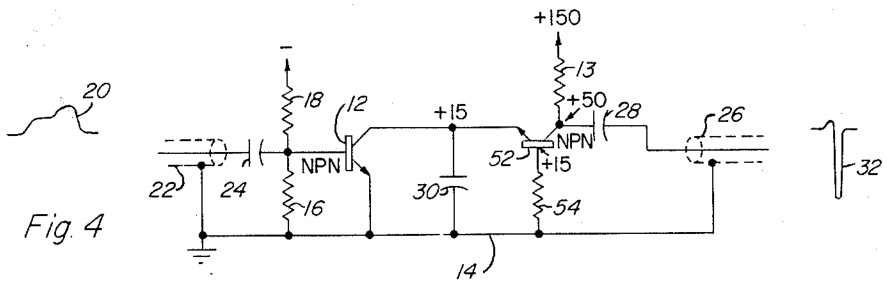
FIG. 4 is a diagram similar to FIG. 1, showing a circuit utilizing a normal avalanche transistor.

The circuit of FIG. 4 differs from that of FIG. 1 in that a normal avalanche transistor 52 with a base load resistance 54 has been substituted for the punched through avalanche transistor 10 of FIG. 1. A negative going pulse from the transistor 12, as a result of the pulse 20 being applied to the base of such transistor, is applied to the emitter of the transistor 52 to trigger the circuit and produce a narrow output pulse 32 across the output line 26. The transistor 52 of FIG. 4 may also be triggered in the same manner shown in FIGS. 2 and 3.

As specific examples, circuits in accordance with the present invention employing NPN transistors as the pulse forming transistors have produced output pulses of 12 volts across a 50 ohm load provided by a coaxial cable having a 50 ohm characteristic impedance, with such pulses having a rise time of 0.5 millimicrosecond and with a pulse width of 1.3 millimicroseconds at the base of the pulse.

Transistors of the PNP type thus far tried have not produced as short a rise time or as narrow pulses as NPN transistors when operated as pulse forming transistors in the circuits of the present invention, although they can be operated in such circuits to produce narrow pulses having short rise times by merely reversing the polarity of the supply potentials in the various figures and substituting PNP transistors for NPN triggering transistors, or vice versa.

In operation, the pulse forming transistor 10 of FIGS. 1 to 3, or 52 of FIG. 4, has a sufficiently great reverse bias potential applied between the collector and base by the D.C. voltage source connected to resistor 13 that avalanche operations take place even though the emitter of such transistor is connected to a high impedance circuit for direct current so as to be substantially a free or floating electrode. The collector junction of transistor 10 is quiescently reverse biased in a punched through state so that the space charge regions of the emitter and collector junctions overlap. A substantial reverse bias current thus flows in the collector-base circuit through the collector junction, and in FIGS. 1 to 3 the effective built in empedance in the base referred to above causes the emitter terminal to assume a voltage between the base and collector terminal voltages. In FIG. 4 the resistor 54 in the base circuit causes the base terminal voltage to be between the common conductor potential and the collector terminal voltage and, since the transistor 52 is not punched through, the emitter terminal voltage will be approximately that of the base terminal.

A pulse in the forward bias direction from a control transistor, such as the transistors 12 and 34 of FIGS. 1, 2 and 4 applied to the emitter of the pulse forming transistors of such figures, will produce a sudden increase in emitter current which results in an injection of electrons into the base from the emitter. Such electrons move across the base region into the high field region of the collector-base space charge layer where they are accelerated to velocities which release further electrons from the lattice by collision. This results in the coincident production of holes which move back to the emitter base junction and produce a voltage drop across the internal base resistance of transistor 10 or the external base resistance of transistor 52 which tends to forward bias such emitter junction. Thus more electrons are injected into the base which cause further electron-hole pair production in the base-collector space charge region. The result is an avalanche operation which causes regenerative build up of current in the collector-emitter current feedback loop through the transistor 10 or 52 to ground provided by the capacitors 28 and 30 and coaxial line 26. Similarly, a pulse increasing the potential across the collector and base terminals of the pulse forming transistor 10 of FIG. 3 and applied from the control transistor 44 will produce a sudden increase in the reverse bias current in the collector-base circuit of the pulse forming transistor. This increased current flowing through the built in base resistance in punched through transistors or in the external resistance employed in the base circuit of non punched through transistors causes an increase in base potential to thereby produce a forward bias on the emitter junction to initiate the regenerative current build up described above.

The capacitors 28 and 30 provide current feedback between the collector and emitter of the transistor 10 or 52 and for fast pulses should have a resultant series capacitance of 10 micromicrofarads or less. In the circuits of FIGS. 1, 2 and 4, the capacitor 30 should provide high impedance to the triggering pulses and in FIG. 3, it should have lower impedance so as to partly clamp the emitter of transistor 10 to the common conductor 14 during triggering.

Figure 5:
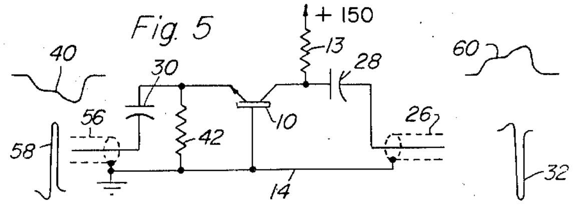
FIG. 5 is a diagram similar to FIG. 1, showing a further modified circuit.

In the circuits of FIGS. 1 to 4, a triggering transistor 12, 34 or 44 has been employed to provide a high impedance triggering circuit and act as a buffer to prevent the pulse produced by the pulse forming transistor 10 or 52 and its associated circuit from being transmitted back through the input coaxial line 22. It is, however, possible to introduce a triggering pulse directly into the current loop containing the capacitors 28 and 30 at any position around the loop. For example, as shown in FIG. 5, a coaxial line 56, in addition to the coaxial line 26, can be employed to introduce a series triggering pulse, such as the negative pulse 40 of FIG. 5, into the current loop in series between the common conductor 14 and the capacitor 30. This triggers the transistor 10 to produce a pulse which is transmitted back through the coaxial line 56 as a positive going narrow pulse 58 having a short rise time and which is transmitted as a negative going similar pulse 32 through the coaxial line 26. Similarly, a positive going triggering pulse 60 introduced into the current loop through the coaxial line 26 will cause triggering of the transistor 10 to produce resulting pulses 32 and 58 in the coaxial lines 26 and 56 respectively. The circuit is otherwise similar to that of FIG. 3 and employs a self biasing resistor 42 in the emitter circuit of the transistor 10 in parallel with the capacitor 30.

The present circuits result in the production of out-put pulses of considerable amplitude which are very narrow and have extremely short rise time and which are of substantially the same amplitude irrespective of the shape of the triggering pulses so as to substantially eliminate amplitude jitter. Such pulses are produced at a substantially constant delay time after the trigger pulse reaches a given amplitude so as to provide very low time jitter. In the circuits of FIGS. 1 and 4, such delay time can, however, be varied by varying the potential applied to the emitter of the control triggering transistor 12.

I claim:

1. A device for producing a voltage pulse having a short time rise, which comprises, a transistor having a collector, an emitter and a base and capable of avalanche operation, said device having a steady state condition and including an emitter circuit causing said emitter to be self biased during said steady state condition, a current supply circuit for said collector including a voltage source and a current limiting impedance between said source and said collector for reverse biasing the collector junction of said transistor and causing the flow of steady state collector and base current, a regenerative current feedback circuit including a pair of capacitances connected from said emitter and collector to ground, and means to trigger said device by causing the production of a forward bias on said emitter and a resultant regenerative increase in said current to produce said pulse.

2. A device for producing a voltage pulse having a short time rise, comprising a transistor capable of avalanche operation and having a base, an emitter and a collector, said device having a steady state condition, first circuit means connecting said emitter to said base and providing sufficiently high resistance that said emitter is self biased during said steady state condition, second circuit means including a voltage source and a current limiting impedance in series with said collector for applying a reverse bias potential between said collector and said base causing steady state collector-base current, said first and second circuit means including common resistance in series with said base through which said current also flows, a positive current feedback circuit connected through said transistor, and means to trigger said device by causing the production of a forward bias voltage on said emitter and a resultant regenerative increase in said current to produce said pulse.

3. A device for producing a voltage pulse having a short time rise, comprising a transistor capable of punched through avalanche operation and having a base, an emitter and a collector, said device having a punched-through steady state condition, first circuit means connecting said emitter to said base and providing sufficiently high resistance that said emitter is self biased during said steady state condition, second circuit means including a voltage source and a current limiting impedance in series with said collector for applying a reverse bias potential between said collector and said base causing punched through operation of said transistor during said steady state condition and resulting in steady state collector-base current, said first and second circuit means including the common internal base resistance of said transistor in series with said base through which said current also flows, and means to trigger said device by causing the production of a forward bias on said emitter and a resultant increase in said current to produce said pulse.

4. A device for producing a voltage pulse having a short time rise, comprising a transistor capable of avalanche operation and having a base, an emitter and a collector, said device having a steady state condition, first circuit means connecting said emitter to said base and providing sufficiently high resistance that said emitter is self biased during said steady state condition, second circuit means including a voltage source and a current limiting impedance in series with said collector for applying a reverse bias potential between said collector and said base causing avalanche operation of said transistor during said steady state condition and resulting steady state collector-base current, said first and second circuit means including a common resistor in series with said base through which said current also flows, a regenerative current feedback circuit including a pair of capacitances connected from said emitter and collector to ground, and means to trigger said device by causing the production of a forward bias voltage on said emitter and a resultant regenerative increase in said current to produce said pulse.

5. A device for producing a voltage pulse having a short time rise, comprising a transistor capable of punched through avalanche operation and having a base, an emitter and a collector, said device having a punched through steady state condition, first circuit means connecting said emitter to said base and providing sufficiently high resistance that said emitter is self biased during said steady state condition, second circuit means including a voltage source and a current limiting impedance in series with said collector for applying a quiescent reverse bias potential between said collector and said base causing punched through and a steady state collector-base current, said first and second circuit means including the common internal resistance of said first in series with said base through which said current also flows, input circuit means for delivering a signal voltage to said device to trigger said device by causing the production of a forward bias voltage on said emitter and a resultant regenerative increase in said current to produce said pulse, and output pulse circuit means connected to said collector, said first circuit means including a second transistor having a collector and emitter in series in said first circuit means, means to normally reverse bias the emitter of said second transistor to provide said high resistance, said input circuit means being connected to the base of said second transistor to cause said second transistor to drive the emitter of said first transistor in a forward bias direction when said signal voltage is delivered to the base of said second transistor.

6. A device for producing a voltage pulse having a short time rise, comprising a transistor capable of punched through avalanche operation and having a base, an emitter and a collector, said device having a punched through steady state condition, first circuit means connecting said emitter to said base and providing sufficiently high resistance that said emitter is self biased during said steady state condition, second circuit means including a voltage source and a current limiting impedance in series with said collector for applying a reverse bias potential between said collector and said base causing punched through operation of said first transistor during said steady state condition and resulting steady state collector-base current, said first and second circuit means including the common internal resistance of said first transistor in series with said base through which said current also flows, input circuit means for delivering a signal voltage to said device to trigger said device by causing the production of a forward bias voltage on said emitter and a resultant regenerative increase in said current to produce said pulse, and output pulse circuit means connected to said collector, said input circuit means including a second transistor having an emitter and collector in series between said collector and said base of said first transistor, and an input circuit connected to the base of said second transistor to cause said second transistor to drive said collector of said first transistor in a direction to increase said current when said signal voltage is delivered to said base of said second transistor to cause production of said forward bias.

7. A device for producing a narrow voltage pulse having a short rise time, which comprises, a voltage source, a common conductor, a transistor capable of punched through avalanche operation and having a base, an emitter and a collector, said device having a punched through steady state condition, a base circuit providing a conductive connection between said base and said common conductor, an emitter circuit including both a conductive connection and a capacitive connection between said emitter and said conductor, said emitter circuit being of sufficiently high resistance that said emitter is self biased during said steady state condition, a collector circuit including a current limiting impedance between said collector and said voltage source, said voltage source also being connected to said common conductor and providing reverse bias between said collector and said base producing punched through operation and a steady state base current flow, an output circuit connected between said collector and said conductor, said base circuit providing series resistance so that an increase of base current results in changing the bias between said emitter and said base in a forward bias direction, and an input circuit for applying a triggering voltage to said collector in a direction increasing said base current to thereby produce said pulse in said output circuit.

8. A device for producing a narrow voltage pulse having a short rise time, which comprises, a voltage source, a common conductor, a transistor capable of punched through avalanche operation and having a base, an emitter electrode and a collector electrode, said device having a punched through steady state condition, a base circuit providing a conductive connection between said base and said conductor, an emitter circuit including both a conductive connection and a parallel capacitive connection between said emitter electrode and said conductor, said emitter circuit being of sufficiently high resistance that said emitter electrode is self biased during said steady state condition, a collector circuit including a current limiting impedance connected between said collector electrode and said voltage source, said voltage source also being connected to said common conductor and providing reverse bias between said collector electrode and said base producing punched through operation of said transistor during said steady state condition, an output circuit connected between said collector electrode and said conductor, said transistor providing internal resistance in series in said base circuit so that an increase of base current results in changing the bias between said emitter electrode and said base in a forward bias direction, and an input circuit for applying a triggering voltage to one of said electrodes in a direction increasing said base current to thereby produce said pulse in said output circuit.

9. A device for producing a narrow voltage pulse having a short rise time, which comprises, a voltage source, a common conductor, a first transistor capable of punched through avalanche operation and having a base, an emitter and a collector, said device having a punched through steady state condition, a base circuit providing a conductive connection between said base and said conductor, an emitter circuit including parallel conductive and capacitive connections between said emitter and said conductor, said emitter circuit being of sufficiently high resistance that said emitter is self biased during said steady state condition, a collector circuit including a current limiting impedance connected between said collector and said voltage source, said voltage source also being connected to said common conductor and providing reverse bias between said collector and said base producing punched through operation of said transistor during said steady state condition, an output circuit connected between said collector and said conductor through a coupling capacitor, said transistor providing internal resistance in series in said base circuit so that an increase of base current results in changing the bias between said emitter and said base in a forward bias direction, and an input circuit including a second transistor for applying a triggering voltage to the collector of said first transistor in a direction increasing said base current to thereby produce said pulse in said output circuit.

References Cited by the Examiner

UNITED STATES PATENTS

| | | | |
|---|---|---|---|
| 2,644,894 | 7/53 | Lo et al. | 307—88.5 |
| 2,790,034 | 4/57 | McAfee | 307—88.5 |
| 2,812,445 | 11/57 | Anderson | 307—88.5 |
| 2,831,984 | 4/58 | Ebers | 307—88.5 |
| 2,906,958 | 9/59 | Kehler et al. | 324—158 |

FOREIGN PATENTS

| | | |
|---|---|---|
| 748,487 | 5/56 | Great Britain. |

OTHER REFERENCES

Pub. I, Schenkel & Statz, "Voltage Punch-Through and Avalanche Breakdown and Their Effect on the Maximum Operating Voltages for Junction Transistors," pages 614 to 625, National Electronics Conference, vol. X, February 8, 1955 (page 618 relied on).

Pub. II, Statz & Pucel, "The Spacistor . . . ," pages 317 to 324, Proceedings of the I.R.E., vol. 45, No. 3, March 1957 (page 321 relied on).

Hurley: Junction Transistor Electronics, Wiley & Sons, New York, 1958 (pages 153, 158, 340 relied on).

Beale et al.: "A Study of High-Speed Avalanche Transistors," Proceedings of the Institution of Electrical Engineers, vol. 104, Part B (pages 394–402) (page 399 relied on).

ARTHUR GAUSS, *Primary Examiner.*

GEORGE N. WESTBY, JOHN W. HUCKERT, *Examiners.*